Figure 1:
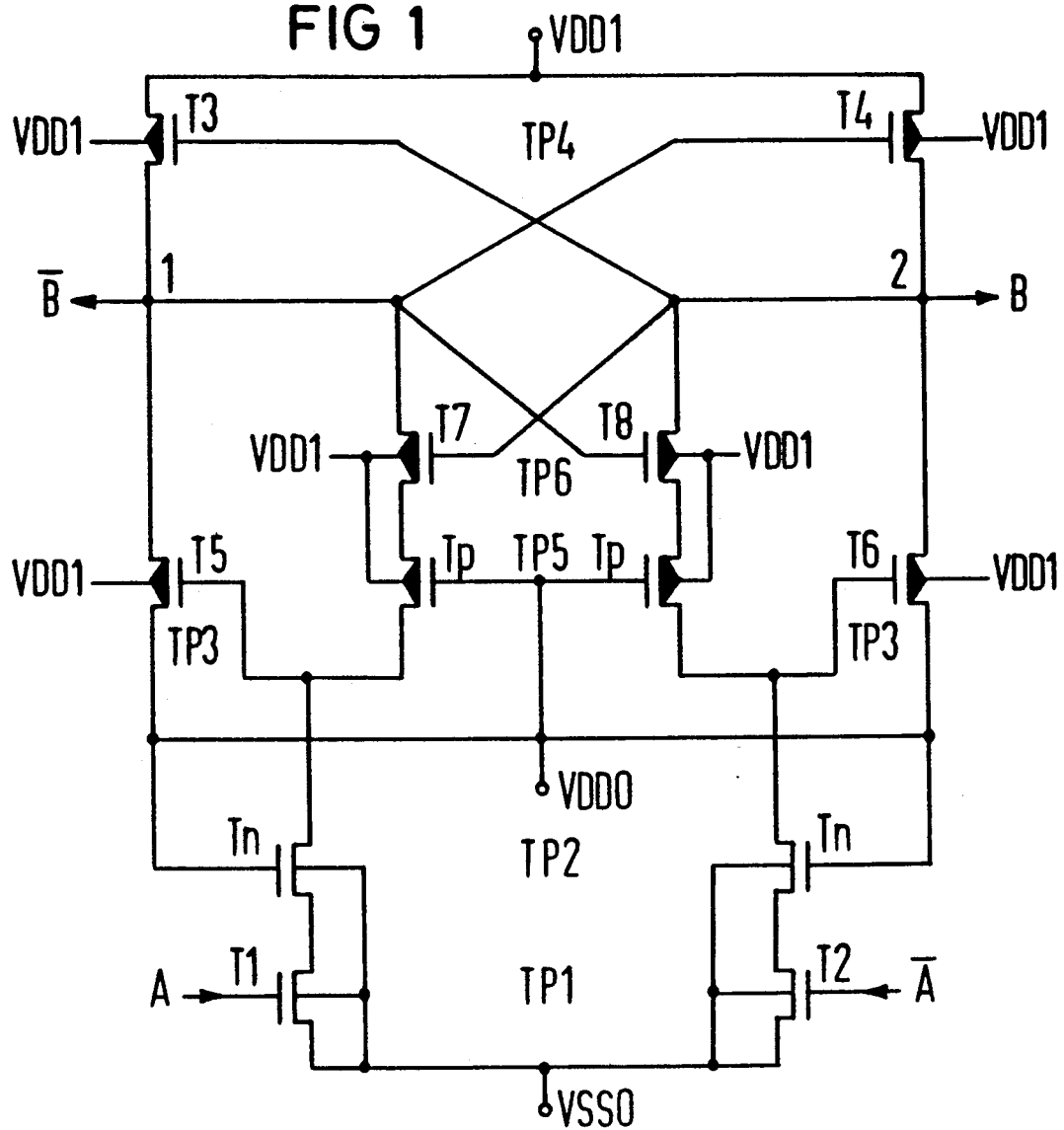

United States Patent [19]

Harter

[11] Patent Number: 5,245,228
[45] Date of Patent: Sep. 14, 1993

[54] LEVEL INVERTER CIRCUIT

[75] Inventor: Johann Harter, Reichertshausen, Fed. Rep. of Germany

[73] Assignee: Siemens Aktiengesellschaft, Munich, Fed. Rep. of Germany

[21] Appl. No.: 854,379

[22] Filed: Mar. 19, 1992

[30] Foreign Application Priority Data

Mar. 22, 1991 [EP] European Pat. Off. ........ 91104578.9

[51] Int. Cl.$^5$ ............................................ H03K 19/175
[52] U.S. Cl. ..................................... 307/475; 307/448; 307/451
[58] Field of Search ......................... 307/475, 448, 451

[56] References Cited

U.S. PATENT DOCUMENTS

| | | | |
|---|---|---|---|
| 4,845,381 | 7/1989 | Cuevas | 307/451 |
| 4,920,284 | 4/1990 | Deuda | 307/475 |
| 4,978,870 | 12/1990 | Chen et al. | 307/451 |
| 4,996,443 | 2/1991 | Tateno | 307/475 |
| 5,017,815 | 5/1991 | Shah et al. | 307/451 |
| 5,111,078 | 5/1992 | Miyamoto | 307/475 |

FOREIGN PATENT DOCUMENTS

| | | |
|---|---|---|
| 3729925 | 3/1989 | Fed. Rep. of Germany . |
| 3733046 | 4/1989 | Fed. Rep. of Germany . |
| 22010592 | 8/1988 | United Kingdom . |

OTHER PUBLICATIONS

H. Terletzki, L. Risch: "Operating Conditions of Dual Gate Inverters for Hot-Carrier Reduction", pp. 191, 192.

"8182 Motorola Technical Developments, Clement: Process-Tolerant High Level Shifter", vol. 7, Oct. 1987, p. 84.

Electronic Design, 33(1985) Spet., No. 21, Shackle: "Standard cells step in to ease the design of high-voltage chips", 5 pp.

Primary Examiner—Edward P. Westin
Assistant Examiner—Andrew Sanders
Attorney, Agent, or Firm—Herbert L. Lerner; Laurence A. Greenberg

[57] ABSTRACT

A monolithically integrated level inverter circuit converts signals with a first potential difference to signals with a second potential difference. The circuit contains six pairs of transistors.

16 Claims, 2 Drawing Sheets

LEVEL INVERTER CIRCUIT

The invention relates to a monolithically integrated level inverter circuit.

In modern microelectronics, various semiconductor technologies exist that work with different supply voltages and signal levels internally of the chip. Such voltages and levels can be generated "on chip" by means of level inverter circuits.

German Published, Non-Prosecuted Application DE 37 29 925 A1 discloses a monolithically integrated CMOS-type level inverter circuit. If such a circuit is produced with small structures (up to approximately 1 μm), then with n-channel transistors, in which potential differences of greater than 6 to 10 V occur, the known problem of hot charge carriers ("hot electrons") appears. Reference is also made to an article by H. Terletzki and L. Risch entitled "Operating Conditions of Dual-Gate Inverters for Hot-Carrier Reduction", in ESSDERC 86, beginning at page 191. In n-channel transistors, that leads to undesirable degradation phenomena, such as an increase in the operating voltage $V_{th}$ and a drop in the drain-to-source current $I_{ds}$. The same is true for p-channel transistors ("hot holes").

In order to avoid such effects, it is known from German Published Non-Prosecuted Application DE 37 33 046 A1 to provide further transistors, all of the same channel type, which are connected to a constant potential at their gate.

It is also common at present to use dielectrics for the gates of MOS transistors that have the smallest possible thickness, particularly dielectrics having a thickness of 25 nm and less. In operation, high electric field intensities then occur between the gate and the channel region. That can lead to undesirable breakdowns of the gate dielectric and thus to the destruction of the affected transistor.

It is accordingly an object of the invention to provide a monolithically integrated level inverter circuit, which overcomes the hereinafore-mentioned disadvantages of the heretofore-known devices of this general type and which is insensitive to such electrical stress, or in other words in which even when relatively high voltages are used, the occurrence of hot electrons and hot holes and the danger of gate breakdown are largely precluded.

With the foregoing and other objects in view there is provided, in accordance with the invention, a monolithically integrated level inverter circuit, comprising first, second, third, fourth, fifth and sixth pairs of transistors each having sources, drains, gates and channel paths; the transistors of the first and second transistor pairs being of a first channel type and the transistors of the third, fourth, fifth and sixth transistor pairs being of a second channel type; the sources of the transistors of the first transistor pair being connected to a first potential; the gates of the transistors of the first transistor pair respectively receiving an input signal and a complementary input signal having levels of the first potential and of a second potential; the drains of the transistors of the first transistor pair each being connected to the source of a respective one of the transistors of the second transistor pair; the gates of the transistors of the second transistor pair being connected to the second potential; the channel path of one of the transistors of the third transistor pair being connected in series with the channel path of one of the transistors of the fourth transistor pair defining a first circuit node for an output signal of the level inverter circuit at the drain of the one transistor of the fourth transistor pair; the channel path of the other of the transistors of the third transistor pair being connected in series with the channel path of the other of the transistors of the fourth transistor pair defining a second circuit node for an output signal of the level inverter circuit at the drain of the other transistor of the fourth transistor pair; the gate of one of the transistors of the fourth transistor pair being connected to the drain of the other of the transistors of the fourth transistor pair, and the gate of the other transistor of the fourth transistor pair being connected to the drain of the one transistor of the fourth transistor pair: the sources of the transistors of the fourth transistor pair being connected to a third potential; the drains of the transistors of the third transistor pair being connected to the second potential; the channel path of one transistor of the fifth transistor pair being connected in series with the channel path of one transistor of the sixth transistor pair, and the channel path of the other transistor of the fifth transistor pair being connected in series with the channel path of the other of the transistors of the sixth transistor pair; the drains of the transistors of the fifth transistor pair each being connected to the gate of a respective one of the transistors of the third transistor pair; the gates of the transistors of the fifth transistor pair being connected to the second potential; and the gate of one of the transistors of the sixth transistor pair being connected to the source of the other of the transistors of the sixth transistor pair and to one of the circuit nodes, and the gate of the other transistor of the sixth transistor pair being connected to the source of the one transistor of the sixth transistor pair and to the other of the circuit nodes.

In accordance with another feature of the invention, the transistors of the first channel type are of the n-channel type, and the transistors of the second channel type are of the p-channel type.

In accordance with a further feature of the invention, the second potential is more positive than the first potential and more negative than the third potential.

In accordance with an added feature of the invention, the transistors of the first channel type are of the p-channel type, and the transistors of the second channel type are of the n-channel type.

In accordance with an additional feature of the invention, the second potential is more negative than the first potential and more positive than the third potential.

In accordance with yet another feature of the invention, the transistors of the p-channel type have substrate regions connected to the most positive of the three potentials or to a potential being more positive than the three potentials.

In accordance with yet a further feature of the invention, the transistors of the n-channel type have substrate regions connected to the most negative of the three potentials or to a potential being more negative than the three potentials.

In accordance with a concomitant feature of the invention, the input signals are signals having constant potential values being equal to the first potential and the second potential.

Other features which are considered as characteristic for the invention are set forth in the appended claims.

Although the invention is illustrated and described herein as embodied in a level inverter circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
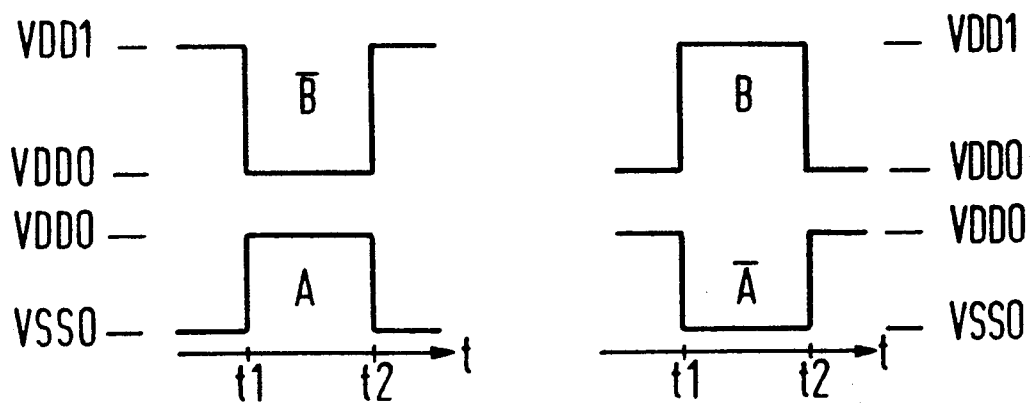
Figure 3:
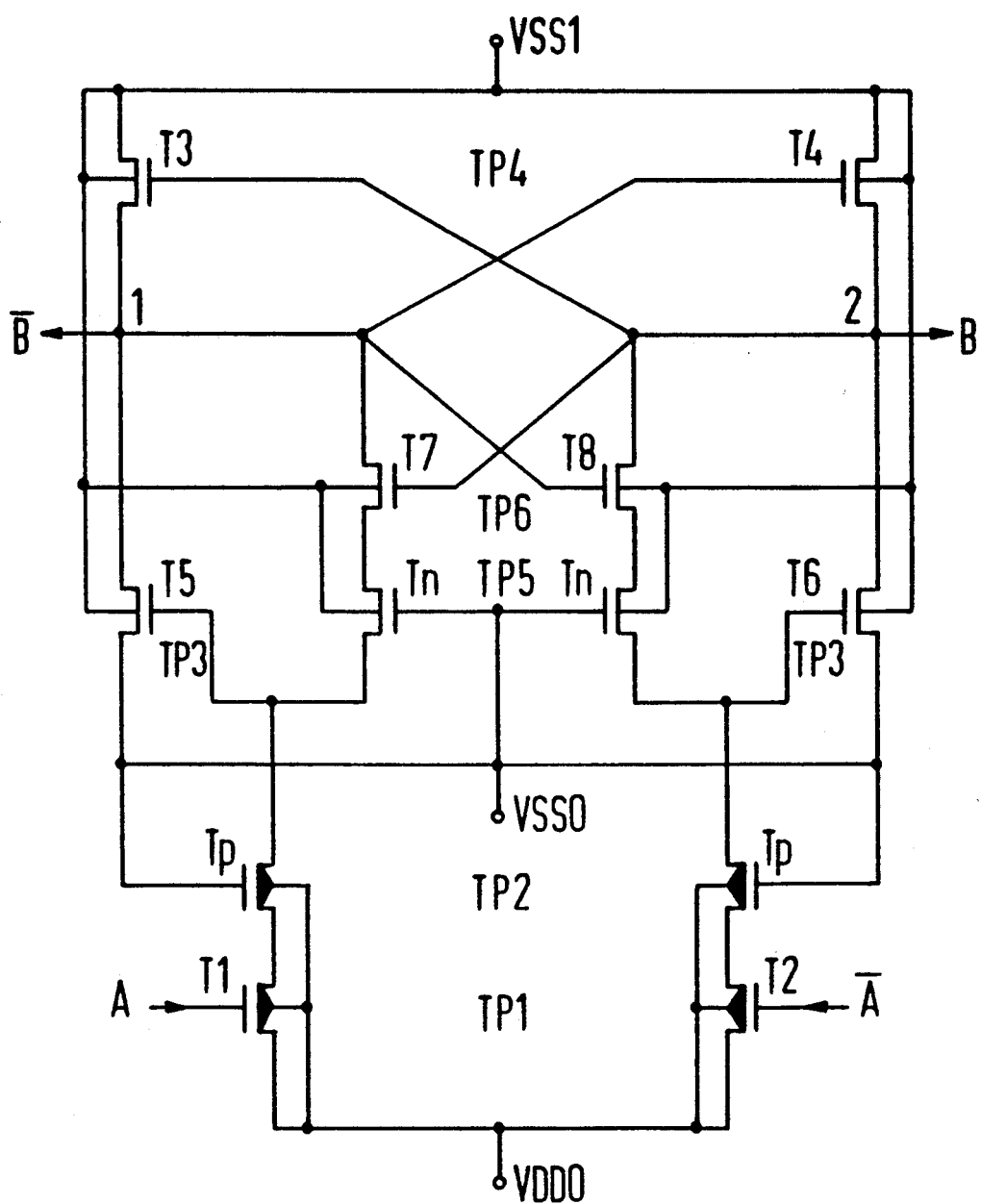

FIGS. 1 and 3 are schematic circuit diagrams of advantageous embodiments of the invention; and FIG. 2 is a diagram of input and output signals.

Referring now to the figures of the drawing in detail and first, particularly, to FIG. 1 thereof, there is seen an embodiment of a level inverter circuit according to the invention which includes a first pair of transistors TP1, with n-channel transistors T1, T2, having sources which are connected to a first potential VSS0. During operation, an input signal ca be applied to the gate of one transistor T1.

One level of this signal, for instance the low level, has the first potential VSS0, and its other level, for instance the high level, has a second potential VDD0. The value of the first potential VSS0 may be 0 V (in which case it is typically referred to as ground), while that of the second potential VDD0 is, for instance, 3 V. In operation, an input signal $\overline{A}$ that is complementary to an input signal A can be applied to the gate of the other transistor T2.

The level inverter circuit also includes a second transistor pair TP2, with transistors Tn, that are again of the n-channel type. The drains of the transistors T1, T2 of the first transistor pair TP1 are respectively connected to the sources of the associated transistors Tn of the second transistor pair TP2. The gates of the transistors Tn of the second transistor pair TP2 are connected to the second potential VDD0.

The circuit also includes a third transistor pair TP3 with transistors T5, T6 and a fourth transistor pair TP4 with transistor T3, T4. These transistors (T3 to T6) are of the p-channel type. The channel paths of the transistors T5 and T3 of the third and fourth transistor pairs TP3, TP4 are connected in series with one another. Correspondingly, the channel paths of the transistors T6 and T4 of the third and fourth transistor pairs TP3, TP4 are likewise connected in series. First and second circuit nodes 1, 2 for output signals $\overline{B}$, B of the level inverter circuit are created at the drains of the transistors T3, T4 of the fourth transistor pair TP4 (corresponding to the sources of the transistors T5, T6 of the third transistor pair TP3). The output signals $\overline{B}$, B are complementary to one another. The gate of the first transistor T3 of the fourth transistor pair TP4 is connected to the drain of the second transistor T4 of the fourth transistor pair TP4. Correspondingly, the gate of the second transistor T4 of the fourth transistor pair TP4 is also connected to the drain of the first transistor T3 of the fourth transistor pair TP4. The gates and drains of the transistors T3, T4 of the fourth transistor pair TP4 are accordingly connected to one another crosswise, and are thus also each connected to a respective one of the two circuit nodes 2, 1 and to the source of a respective one of the transistors T6, T5 of the third transistor pair TP3. The sources of the transistors T3, T4 of the fourth transistor pair TP4 are connected to a third potential VDD1. The drains of the transistors T5, T6 of the third transistor pair TP3 are connected to the second potential VDD0 and thus also to the gates of the transistors Tn of the second transistor pair TP2.

Furthermore, the level inverter circuit includes a fifth transistor pair TP5 with two transistors Tp and a sixth transistor pair TP6 with two transistors T7, T8. One transistor of each pair, that is one transistor Tp of the fifth transistor pair TP5 and one transistor T7 or T8 of the sixth transistor pair TP6 are connected in series with one another through their channel paths. The drain of each of the transistors Tp of the fifth transistor pair TP5 is connected to the gate of a respective one (T5 or T6) of the two transistors T5, T6 of the third transistor pair TP3 and thus also to the drain of a respective one of the transistors Tn of the second transistor pair TP2. The gates of the two transistors Tp of the fifth transistor pair TP5 are connected to the second potential VDD0. The gate of the first transistor T7 of the sixth transistor pair TP6 is connected to the second circuit node 2 and thus also to the gate of the transistor T3 of the fourth transistor pair TP4. The gate of the first transistor T7 of the sixth transistor pair TP6 is also connected to the source of the second transistor T8 of the sixth transistor pair TP6. Correspondingly, the gate of the second transistor T8 of the sixth transistor pair TP6 is connected to the first circuit node 1 and thus also to the gate of the transistor T4 of the fourth transistor pair TP4. The gate of the second transistor T8 of the sixth transistor pair TP6 is likewise connected to the source of the first transistor T7 of the sixth transistor pair TP6. The gates and sources of the transistors T7, T8 of the sixth transistor pair TP6 are accordingly each connected crosswise to one another.

In the embodiment of FIG. 1, the transistors T1, T2, Tn of the first two transistor pairs TP1, TP2 are of the n-channel type, as mentioned above. Correspondingly, the transistors T3 to T8 and Tp of the third through sixth transistor pairs TP3-TP6 are of the p-channel type. It is advantageous if the second potential VDD0 is more positive than the first potential VSS0 and more negative than the third potential VDD1.

The function of the embodiment of the level inverter circuit shown in FIG. 1 will be described below, in conjunction with the signal course shown in FIG. 2 for the input signals A, $\overline{A}$ and the output signals B, $\overline{B}$. By way of example, the following values are assumed for the three potentials VSS0, VDD0, and VDD1: first potential VSS0=0 V; second potential VDD0=3 V; third potential VDD1=8 V.

Up to a first time t1, one input signal A has a low value of the first potential VSS0=0 V, and correspondingly the other input signal $\overline{A}$ has a high value of the second potential VDD0=3 V. The transistor T1 of the first transistor pair TP1 is blocked. The following transistors of the level inverter circuit are made conducting: the transistor T2 of the first transistor pair TP1, the transistor Tn of the second transistor pair TP2 which is connected thereto, and the transistor T6 of the third transistor pair TP3. Due to the connection of the transistor T6 of the third transistor pair TP3 to the second potential VDD0=3 V, the second circuit node 2 assumes the value of the second potential VDD0=3 V. This corresponds to the low level of one output signal B. In order to ensure that the third transistor T3 of the fourth transistor pair TP4 will in turn be made conducting, the first circuit node 1 and thus the other output signal $\overline{B}$, which is complementary to the first output signal B, also assume the value of the third potential VDD1=8 V, which is equivalent to the high level of the second output signal $\overline{B}$.

Consequently, the following transistors are blocked: the transistor T4 of the fourth transistor pair TP4, the transistor T8 of the sixth transistor pair TP6, and the transistor Tp of the fifth transistor pair TP5 which is connected thereto. On the other hand, the transistor T7 of the sixth transistor pair TP6 is conducting, and thus the transistor Tp of the fifth transistor pair TP5 is also connected to it. The third potential VDD1=8 V is therefore present at the gate of the transistor T5 of the third transistor pair TP3, as a result of which this transistor (T5) blocks.

Between the first time t1 and a second time t2, the first input signal A has the high level of the second potential VDD0=3 V. Correspondingly, the second input signal $\overline{A}$, which is complementary to the first input signal A, has the low level of the first potential VSS0=0 V. This state is precisely the reverse of the state already described that is prevailing until the first time t1. For this reason, in each of the six transistor pairs TP1 to TP6, the first transistors T1, Tn (connected to the transistor T1), T5, T3, Tp (the one connected to the transistor T7) and T7 assume the state assumed prior to the first time t1 by the respective other transistors T2, Tn (connected to T2), T6, T4, Tp (the one connected to the transistor T8) and T8, and vice versa (given the symmetry in terms of the circuit and signals, the explanation need not be any more detailed for one skilled in the art). The first output signal B thus, as a high level, has the value of the third potential VDD1=8 V, while the second output signal $\overline{B}$, that is complementary to an output signal B, has as a low level at the value of the second potential VDD0=3 V.

The same circuit and signal states then prevail from the second time t2 as in the already described period of time until the first time t1.

Viewed as a whole, the input signals A, $\overline{A}$ accordingly have signal levels with the values of the first (VSS0) and second (VDD0) potentials, and the output signals B, $\overline{B}$ have signal levels with the values of the second (VDD0) and third (VDD1) potentials.

The occurrence of hot electrons or hot holes is accordingly avoided in the present invention by providing that all of the circuit segments by way of which the maximally occurring voltage (third potential VDD1 minus first potential VSS0) are connected, include two transistors, each of the same conduction type: that is, the transistor T7 and the transistor Tp connected to it, and the transistor T8 and the transistor Tp connected to it, respectively, and the transistor T1 and the transistor Tn connected to it, and the transistor T2 and the transistor Tn connected to it, respectively.

The danger of a gate dielectric breakdown is avoided in the present invention by providing that a greater voltage than the third potential VDD1 minus the second potential VDD0, or than the second potential VDD0 minus the first potential VSS0, is not present at any gate dielectric.

FIG. 3 shows an embodiment of the invention in which the transistors T1, T2 of the first transistor pair TP1 and the transistors Tp of the second transistor pair TP2 are transistors of the p-channel type, while the transistors T3 to T8 of the third, fourth and sixth transistor pairs TP3, TP4, TP6 and the transistors Tn of the fifth transistor pair TP5 are transistors of the n-channel type. The value of the second potential, which is indicated in this case by reference symbol VSS0, is more negative than that of the first potential, which is indicated in this case by reference symbol VDD0, and is more positive than that of the third potential, which is indicated in this case by reference symbol VSS1. With the embodiment of FIG. 3, input signals A, $\overline{A}$ having level values, for instance, of the second potential VSS0=0 V and of the first potential VDD0=3 V can be converted into output signals B, $\overline{B}$ having level values, for instance, of the third potential VSS1=−5 V and of the second potential VSS0−0 V.

In order to avoid the appearance of latchup effects, it is advantageous, independently of the particular embodiment of the invention, to connect the substrate regions of those transistors that are of the p-channel type (which are the transistors T3 to T8 and Tp in FIG. 1; and the transistors T1, T2, Tp in FIG. 3) to the most positive of the three potentials VSS0, VDD0, VDD1 or VDD0, VSS0, VSS1, or to an even more positive potential. The same is correspondingly true for the substrate regions of the n-channel transistors (which are the transistors T1, T2, Tn in FIG. 1; and the transistors T3 to T8 and Tn in FIG. 3), which should advantageously be connected to the most negative of the three potential VSS0, VDD0, VDD1 or VDD0, VSS0, VSS1, or to an even more negative potential.

In the case of the embodiment of FIG. 1, these are the third potential VDD1 and the first potential VSS0. In the case of the embodiment of FIG. 3, they are the first potential VDD0 and the third potential VSS1.

During operation, the level inverter circuit according to the invention furnishes output signals B, $\overline{B}$ with level values that correspond to the difference between the value of the second potential VDD0 or VSS0 and that of the third potential VDD1 or VSS1. If another circuit connected to the output side of the level inverter circuit, such as a word line driver circuit in a DRAM, which of course in general is intended to switch a high level that is elevated above other circuit parts of the DRAM, is then operated with the level inverter circuit of the invention, then the low levels of its output signals B, $\overline{B}$ (assuming positive logic) are higher than the typical low levels of the other circuit (in this case assuming that it is a word line driver circuit). However, this is no problem if this is taken into account in the switching behavior of the input stage of this other circuit, or in other words if the input stage is dimensioned in such a way that its low level path is blocked even if one of the output signals B, $\overline{B}$ of the level inverter circuit having its low level is applied to it. However, this provision is merely a simple dimensioning provision. In other words, it is within the competence of any person of average skill in the applicable art.

Thus the level inverter circuit according to the invention can also be used in DRAMs, and in particular in the word line circuits thereof.

The invention is also applicable to input signals A, $\overline{A}$ that do not exhibit any time-dependent change in their levels but instead have levels that are a constant potential. The function of the level inverter circuit according to the invention is then that of pure potential shifting.

I claim:

1. A monolithically integrated level inverter circuit, comprising:
   first, second, third, fourth, fifth and sixth pairs of transistors each having sources, drains, gates and channel paths;
   said transistors of said first and second transistor pairs being of a first channel type and said transistors of said third, fourth, fifth and sixth transistor pairs being of a second channel type;

the sources of said transistors of said first transistor pair being connected to a first potential;

the gates of said transistors of said first transistor pair respectively receiving an input signal and a complementary input signal having levels of the first potential and of a second potential;

the drains of said transistors of said first transistor pair each being connected to the source of a respective one of said transistors of said second transistor pair;

the gates of said transistors of said second transistor pair being connected to the second potential;

the channel path of one of said transistors of said third transistor pair being connected in series with the channel path of one of said transistors of said fourth transistor pair defining a first circuit node for an output signal of the level inverter circuit at the drain of said one transistor of said fourth transistor pair;

the channel path of the other of said transistors of said third transistor pair being connected in series with the channel path of the other of said transistors of said fourth transistor pair defining a second circuit node for an output signal of the level inverter circuit at the drain of said other transistor of said fourth transistor pair;

the gate of one of said transistors of said fourth transistor pair being connected to the drain of the other of said transistors of said fourth transistor pair, and the gate of the other transistor of said fourth transistor pair being connected to the drain of the one transistor of said fourth transistor pair;

the sources of said transistors of said fourth transistor pair being connected to a third potential;

the drains of said transistors of said third transistor pair being connected to the second potential;

the channel path of one transistor of said fifth transistor pair being connected in series with the channel path of one transistor of said sixth transistor pair, and the channel path of the other transistor of said fifth transistor pair being connected in series with the channel path of the other transistor of said sixth transistor pair;

the drains of said transistors of said fifth transistor pair each being connected to the gate of a respective one of said transistors of said third transistor pair;

the gates of said transistors of said fifth transistor pair being connected to the second potential; and the gate of one of said transistors of said sixth transistor pair being connected to the source of the other of said transistors of said sixth transistor pair and to one of said circuit nodes, and the gate of the other transistor of said sixth transistor pair being connected to the source of the one transistor of said sixth transistor pair and to the other of said circuit nodes.

2. The level inverter circuit according to claim 1, wherein said transistors of the first channel type are of the n-channel type, and said transistors of the second channel type are of the p-channel type.

3. The level inverter circuit according to claim 1, wherein the second potential is more positive than the first potential and more negative than the third potential.

4. The level inverter circuit according to claim 1, wherein said transistors of the first channel type are of the p-channel type, and said transistors of the second channel type are of the n-channel type.

5. The level inverter circuit according to claim 1, wherein the second potential is more negative than the first potential and more positive than the third potential.

6. The level inverter circuit according to claim 2, wherein said transistors of the p-channel type have substrate regions connected to the most positive of the three potentials.

7. The level inverter circuit according to claim 2, wherein said transistors of the p-channel type have substrate regions connected to a potential being more positive than the three potentials.

8. The level inverter circuit according to claim 4, wherein said transistors of the p-channel type have substrate regions connected to the most positive of the three potentials.

9. The level inverter circuit according to claim 4, wherein said transistors of the p-channel type have substrate regions connected to a potential being more positive than the three potentials.

10. The level inverter circuit according to claim 2, wherein said transistors of the n-channel type have substrate regions connected to the most negative of the three potentials.

11. The level inverter circuit according to claim 2, wherein said transistors of the n-channel type have substrate regions connected to a potential being more negative than the three potentials.

12. The level inverter circuit according to claim 4, wherein said transistors of the n-channel type have substrate regions connected to the most negative of the three potentials.

13. The level inverter circuit according to claim 4, wherein said transistors of the n-channel type have substrate regions connected to a potential being more negative than the three potentials.

14. The level inverter circuit according to claim 1, wherein the input signals are signals having constant potential values being equal to the first potential and the second potential.

15. The level inverter circuit according to claim 2, wherein the second potential is more positive than the first potential and more negative than the third potential.

16. The level inverter circuit according to claim 4, wherein the second potential is more negative than the first potential and more positive than the third potential.

* * * * *